US006923325B2

(12) United States Patent
Duban-Hu et al.

(10) Patent No.: US 6,923,325 B2
(45) Date of Patent: Aug. 2, 2005

(54) HORIZONTAL CASSETTE

(75) Inventors: Joy Duban-Hu, Burnsville, MN (US);
James Nigg, Howard Lake, MN (US);
Brian Wiseman, Glencoe, MN (US)

(73) Assignee: Entegris, Inc., Chaska, MN (US)

(*) Notice: Subject to any disclaimer, the term of this patent is extended or adjusted under 35 U.S.C. 154(b) by 0 days.

(21) Appl. No.: 10/194,983

(22) Filed: Jul. 11, 2002

(65) Prior Publication Data

US 2003/0010673 A1 Jan. 16, 2003

Related U.S. Application Data

(60) Provisional application No. 60/305,065, filed on Jul. 12, 2001.

(51) Int. Cl.[7] .............................................. B65D 85/48
(52) U.S. Cl. ...................................... 206/711; 206/454
(58) Field of Search ................................ 206/710, 711, 206/454; 220/762, 763, 796, 800, 801; 414/217, 219, 292; 118/500

(56) References Cited

U.S. PATENT DOCUMENTS

| | | |
|---|---|---|
| 4,043,451 A | 8/1977 | Johnson |
| 4,588,086 A | 5/1986 | Coe ........................... 206/454 |
| 4,668,484 A * | 5/1987 | Elliott ........................ 414/217 |
| 4,815,912 A | 3/1989 | Maney et al. |
| 5,024,329 A | 6/1991 | Grohrock |
| 5,452,795 A | 9/1995 | Gallagher et al. |
| 5,482,161 A | 1/1996 | Williams et al. |
| 5,711,427 A | 1/1998 | Nyseth |
| 5,788,082 A | 8/1998 | Nyseth |
| 5,853,214 A | 12/1998 | Babbs et al. |
| 5,915,562 A | 6/1999 | Nyseth et al. |
| 5,944,194 A | 8/1999 | Gregerson et al. |
| 5,960,959 A | 10/1999 | Wu et al. |
| 5,988,392 A | 11/1999 | Hosoi |
| 6,010,008 A | 1/2000 | Nyseth et al. |
| 6,019,241 A * | 2/2000 | Coffey et al. ................ 220/763 |
| 6,105,782 A * | 8/2000 | Fujimori et al. ............. 206/710 |
| 6,206,196 B1 | 3/2001 | Krampotich et al. ......... 206/454 |
| 6,267,245 B1 | 7/2001 | Bores et al. |
| 6,540,467 B1 * | 4/2003 | Zohni et al. ................. 206/710 |

* cited by examiner

*Primary Examiner*—Luan K. Bui
(74) *Attorney, Agent, or Firm*—Patterson, Thuente, Skaar & Christensen, P.A.

(57) ABSTRACT

A cassette, particularly suitable for storing film frames, in a preferred embodiment utilizes an integral shell portion with a plurality of shelves to support a plurality of axially aligned horizontally stacked film frames. A door, preferably vacuum-formed, covers the open front of the shell to enclose the film frames therein. The cassette may have a robotic top and collapsible handles. In a preferred embodiment the handles are U-shaped and slideably engaged with a pair of brackets integral with the sidewall. In another embodiment the handles pivot about an axis parallel to the top of the cassette and attach by a pair of split prongs insertable into a pair of receiving holes. A pair of film frame retention members are pivotally and rotatably attached at the sides of the shell inside the front opening. The restraints are pivotable between an open position where they are aligned with the sidewalls and pointing toward the open front to a film frame retention position where they are rotated to face inwardly in an approximately radial direction. The film frame retention members may be actuated by handles positioned on the top of the enclosure. Alternatively, the retention members may be automatically actuated by a helical cam mechanism with a engagement portion extending below the cassette to contact a surface upon which the cassette is placed. The members may be biased and spring loaded such that they remain in the retention position and/or the open position when so placed.

26 Claims, 6 Drawing Sheets

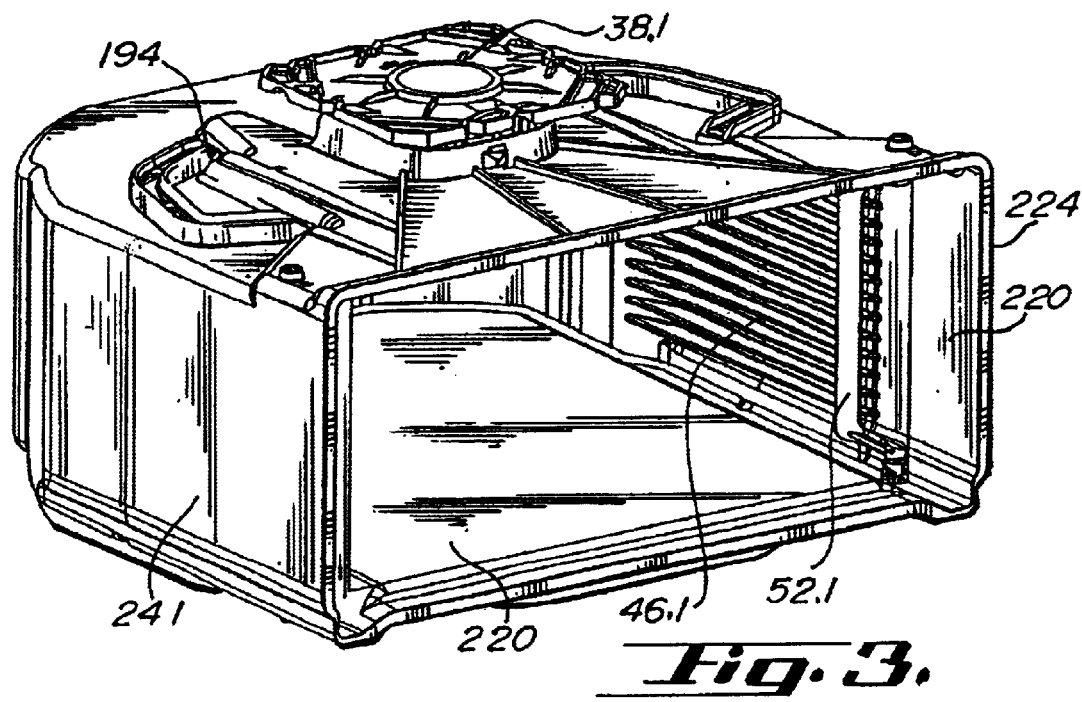
Fig. 3.
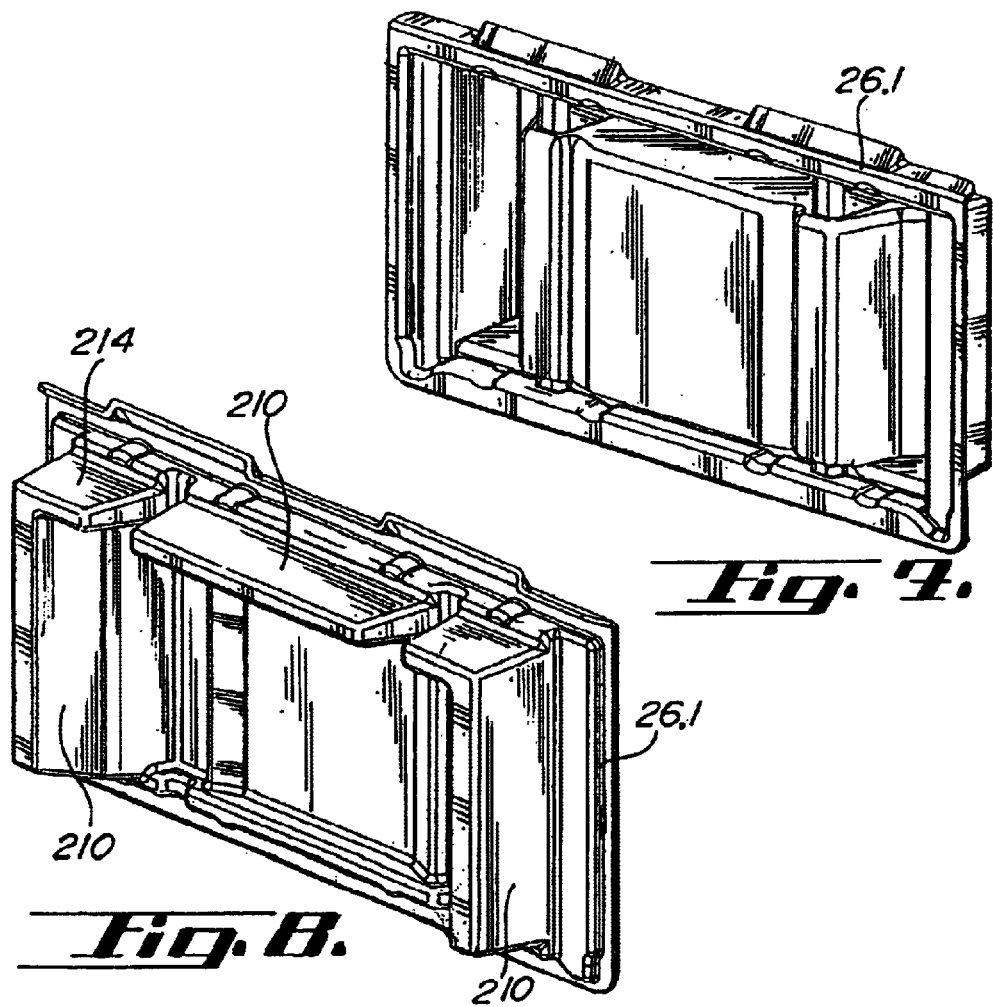
Fig. 4.
Fig. 8.

HORIZONTAL CASSETTE

This application claims benefit of U.S. Provisional Application No. 60/305,065, filed Jul. 12, 2001, said application being incorporated herein by reference.

BACKGROUND OF THE INVENTION

In the semiconductor processing industry semiconductor wafers undergo many steps during the conversion into useful integrated circuits. The wafers and intermediate components must be suitably stored and shipped intermediate the steps. Various containers are known for shipping and storing whole wafers. See for example U.S. Pat. Nos. 4,043,451; 5,788,082; and 5,915,562. The semiconductor processing industry has involved into utilizing larger and larger wafers as a beginning for processing into integrated circuits. Moreover, the industry has gone to thinner wafers, consequently these are substantially more fragile and valuable then previous wafers. The industry now seeks to utilize film frames comprising a circular rigid steel ring with a sheet of adhesive covered material to store and ship 300 mm wafers. Such wafers may be in a whole condition or may be diced up on said film frame. Such film frames are slightly larger than the wafers which they carrier and therefore the conventional 300 mm wafer carriers are not suitably sized nor otherwise appropriate. Moreover, conventional film frame shippers have been made of softer plastic such as polypropylene. It is believed that such polypropylene shippers may lack sufficient strength and rigidity and offer insufficient protection for 300 mm film frames with wafers thereon.

SUMMARY OF THE INVENTION

A cassette, particularly suitable for storing film frames, in a preferred embodiment utilizes an integral shell portion with a plurality of shelves to support a plurality of axially aligned horizontally stacked film frames. A door, preferably vacuum-formed, covers the open front of the shell to enclose the film frames therein. The cassette may have a robotic top and collapsible handles. In a preferred embodiment the handles are U-shaped and slideably engaged with a pair of brackets integral with the sidewall. In another embodiment the handles pivot about an axis parallel to the top of the cassette and attach by a pair of split prongs insertable into a pair of receiving holes. A pair of film frame retention members are pivotally and rotatably attached at the sides of the shell inside the front opening. The restraints are pivotable between an open position where they are aligned with the sidewalls and pointing toward the open front to a film frame retention position where they are rotated to face inwardly in an approximately radial direction. The film frame retention members may be actuated by handles positioned on the top of the enclosure. Alternatively, the retention members may be automatically actuated by a helical cam mechanism with a engagement portion extending below the cassette to contact a surface upon which the cassette is placed. The members may be biased and spring loaded such that they remain in the retention position and/or the open position when so placed.

The handles have a pair of detents that allow them to be inserted into the handle brackets where at they may slide vertically to a carry position and slide downward vertically to a non-use position.

BRIEF DESCRIPTION OF THE FIGURES

FIG. 3 is perspective view of a cassette according to the invention.

FIG. 7 is a front perspective view of a door of a cassette in accordance with the invention herein.

FIG. 8 is a rear perspective view of the door of FIG. 7.

DETAILED DESCRIPTION OF THE PREFERRED EMBODIMENTS

Figure 1:
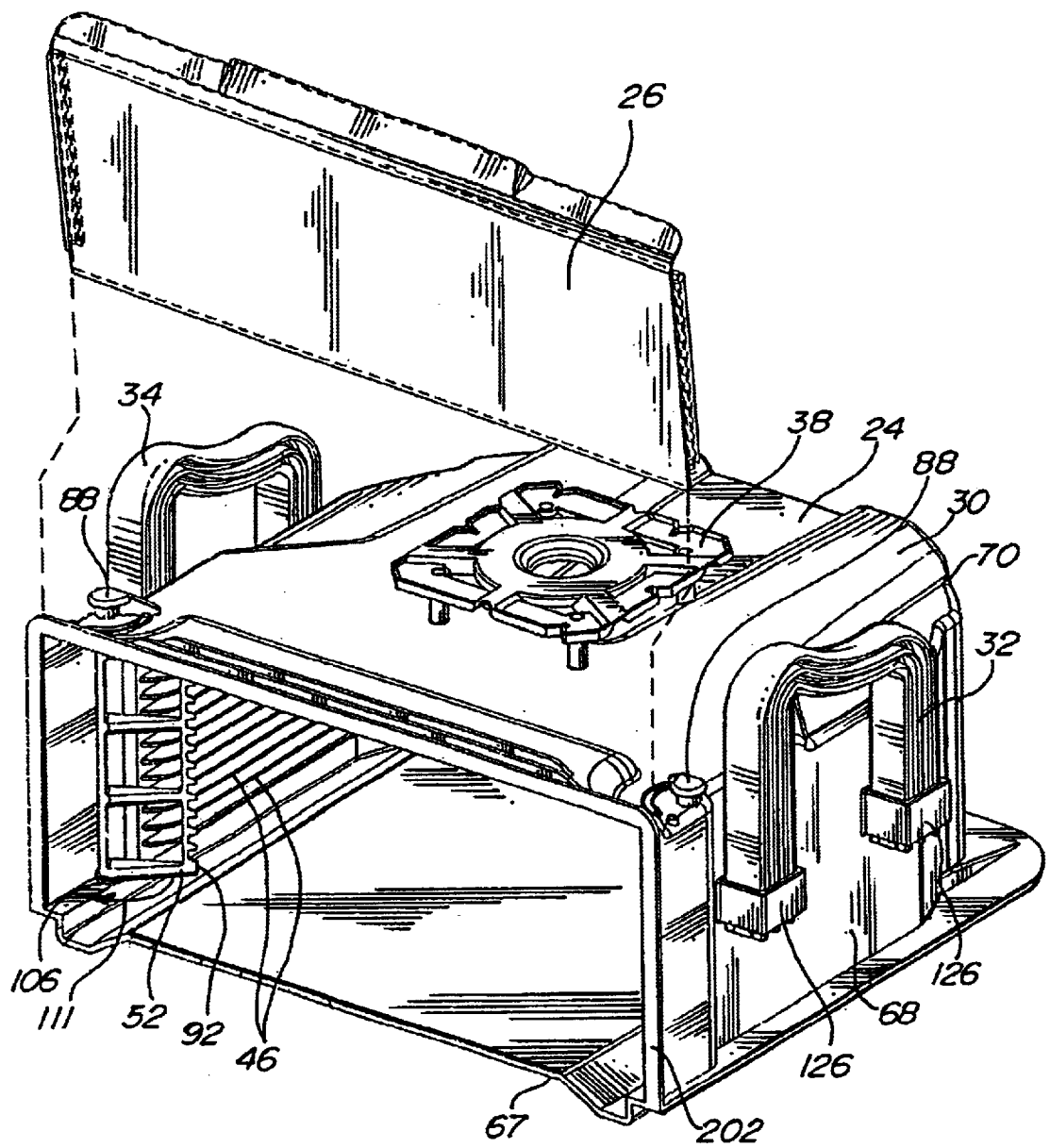
FIG. 1 is a perspective view of another embodiment of a cassette according to the invention.

Referring to FIGS. 1, 2, 3, and 4, two alternative preferred embodiments of assembled cassettes 20, 20.1 are illustrated suitable for holding semiconductor wafers adhered to film frames. Certain aspects of the cassettes are also highly suitable for holding 300 mm wafers without the film frames. These cassettes are known as FOUPS (front opening unified pods) and FOSBS (front opening shipping box) store wafers during shipping and processing. A cassette for the 300 mm wafers would have slightly less width than the film frame cassette and could certainly have other appropriate variations while maintaining the inventive aspects herein. See U.S. Pat. Nos. 6,010,008; 5,915,562; 5,944,194; and 6,267,245 for functional information and disclosure relating to FOUPS and FOSBES. These four patents are incorporated herein by reference.

The cassette embodiments illustrated, a first cassette and a second cassette 20, 20.1 generally comprise a housing portion 24, 24.1 and a door portion 26, 26.1. The housing portion 24, 24.1 includes a shell 30, 30.1, a pair of handles 32, 32.1, 34, 34.1, a robotic flange 38, 38.1, a plurality of shelves 46, 46.1, a pair of retention members 52, 52.1 and a kinematic coupling portion 60. In the first cassette, the retention members are manually actuated. In the second cassette, the retention members are automatically actuated when the cassette is placed on or removed from a surface. The kinematic coupling portion as illustrated in a preferred embodiment has the kinematic coupling contact portions 64 as ribs integral with the housing. A Y-shaped guide-in plate may be used to guide the kinematic coupling partial spheres into engagement with the three pairs of ribs. Such an arrangement is disclosed in U.S. Pat. No. 6,216,874 that is incorporated by reference herein. Each of the cassettes generally have a top 66, a bottom 67, sides 68, an open front 69, and a closed back. 70.

Figure 5:
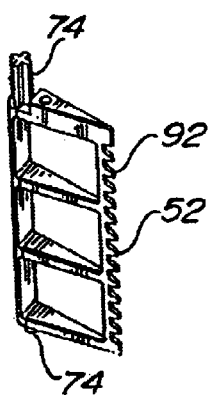
FIG. 5 is a perspective view of a retention member in accordance with the invention.
Figure 13:
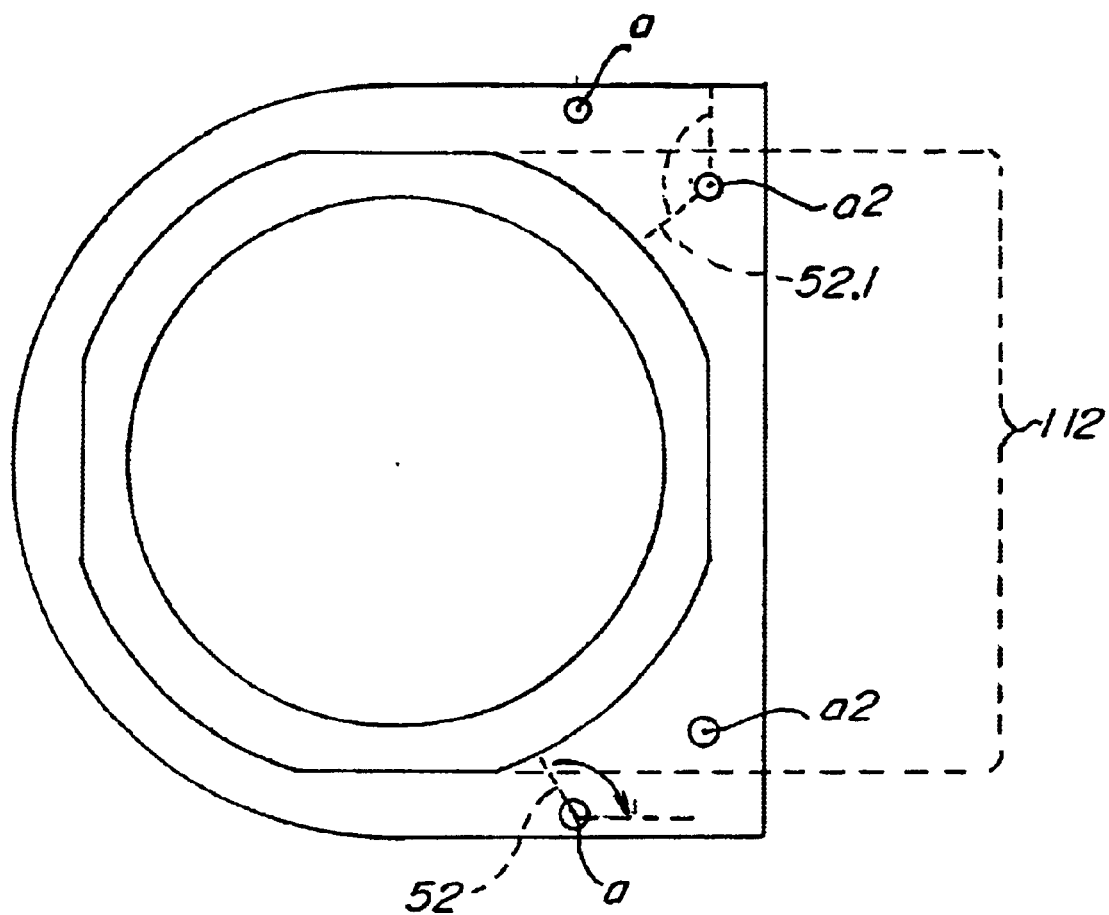
FIG. 13 is a plan diagrammatic view of a cassette with retention members according to the invention herein.

In the first cassette embodiment 20, the wafer retention members 52 have a shaft portion 74 which is rotatably connected to the top 82 and bottom 84 with knobs 88 attached to the retention members external the shell providing external control thereof. The retention members have an engagement portion 92 which can be configured as a saw tooth shape for engaging individual film frames edges 102 or potential wafers. Other configurations of the engagement portion may be utilized such as a soft resilient plastic strip, which is attached to the restraining member. The restraining member may operate on a cam surface 106 and be spring loaded at the top of the retention member 108 to provide suitable holding force when in the retention position or in the open position. FIG. 1 generally shows the restraining member in the retention position with an arrow 111 showing the motion towards the open position. FIG. 13 illustrates a plan view diagram of a cassette with a zone of insertion and withdrawal indicated by the dashed lines. The positioning of the wafer engaging members associated with the first cassette embodiment are illustrated with the axis of rotation identified with the letter a. With the wafer retention member configuration as shown in FIG. 5, the axis of rotation is placed outside the zone of insertion and withdrawal with the engagement portion swingable between the retention position against the film frame and to the non-retention or retracted position adjacent the side wall of the enclosure portion.

Figure 2:
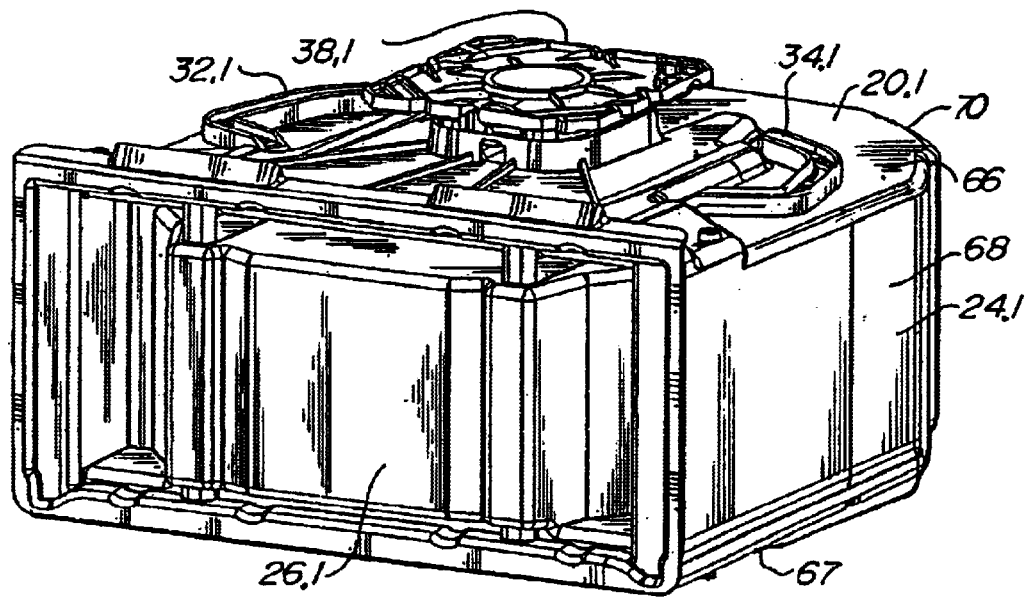
FIG. 2 is a perspective view of a cassette with the door in place according to the invention.
Figure 4:
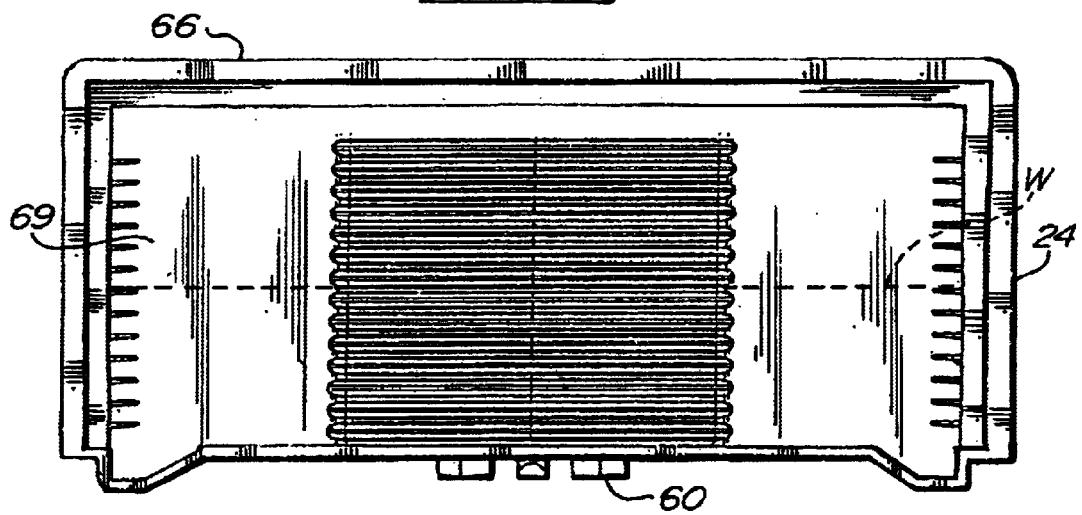
FIG. 4 is a front elevational view of a cassette according to the invention.
Figure 6:
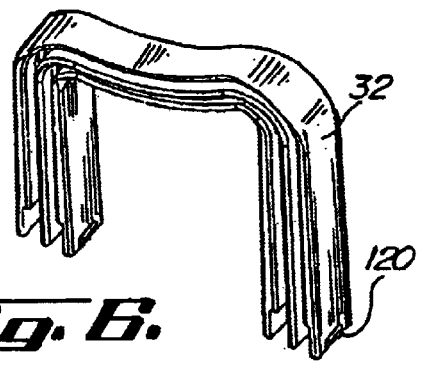
FIG. 6 is a perspective view of a handle for the cassette embodiment of FIG. 1.

Referring particularly to FIGS. 1 and 6, a handle may be formed on injection molded plastic in a generally U-shape with a pair of detents 120 which allows insertion into handle brackets 126 positioned on the side of the shell of the enclosure portion. These brackets may be suitably welded or integrally molded thereon or otherwise attached. A handle is loosely contained within the brackets so that it may be slide upwardly to stop at the detents as shown in FIG. 2 and when not being carried return to the non-use position as illustrated in FIGS. 1, 3, and 5. Such sliding action allows the handles to meet current automation and/or SEMI-standards requirements for the height of the cassette.

Referring to FIGS. 3, 7–13, details of the second preferred embodiment of the cassette are illustrated. In this embodiment the retention members 52.1 may be automatically actuated by a helical cam mechanism 150 comprising a helical cam guide 151 and a cam follower 152 on the retention members with a engagement portion 154 extending below the cassette to contact a surface upon which the cassette is placed. The helical cam guide 151 has a central bore 160 for receiving the lower shaft portion 161 with the engagement portion 154 therethrough. A flange 166 and detents 168 allow the cam guide 151 to be inserted in a hole 172 in the bottom of the cassette and be fixed therein by the detents engaging the top surface 176 of the bottom of the cassette. The retention member has an upper shaft portion 178 that is received in a receiving portion 179 on the top of the enclosure portion. The cam guide has cam surfaces 180 for guiding the cams 152 and rotating the C-shaped retention member 52.1 into and out of actuation with the film frames or wafers as the case may be. This occurs when the engagement portion is raised or lowered with respect to the cassette. For example, when the cassette is seated on a piece of equipment, the engagement portion will be depressed or raised driving the cams up and rotating retention member toward the objects secured in the cassette.

The helical mechanism could have the helical cam surface on the shaft of the retention member and the cam follower portion on the portion attached to the enclosure portion.

The retention member can be spring loaded, such as a helical spring 181, or may simply rely upon gravity to return to the open retracted position correlating with the lowered or downwardly extended engagement portion. FIG. 13 illustrates appropriate positioning of the C-shaped retention member 52.1 with an axis of rotation α2 positioned within the zone of insertion and withdrawal. This provides a suitable position for actuating the retention members by engagement with the surface upon which the cassette is seated.

Figure 9:
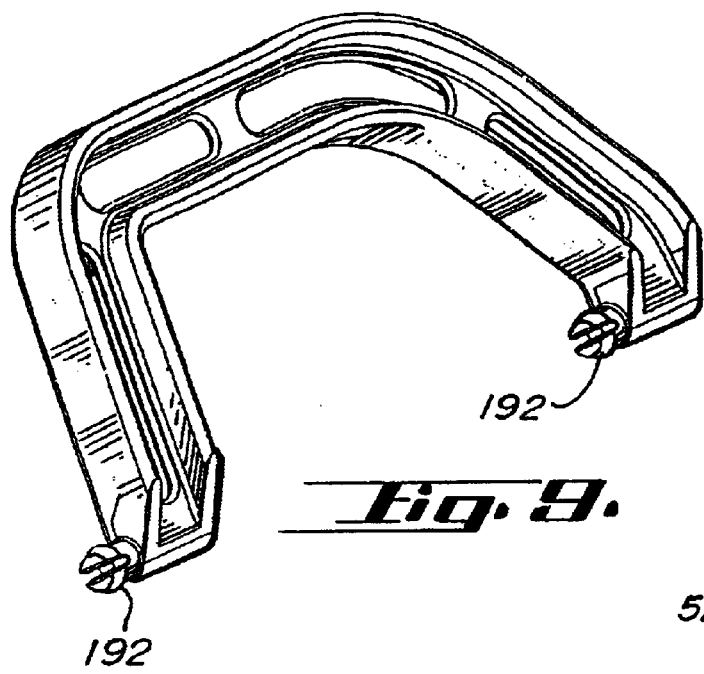
FIG. 9 is a perspective view of a handle for the embodiment of FIG. 2.
Figure 10:
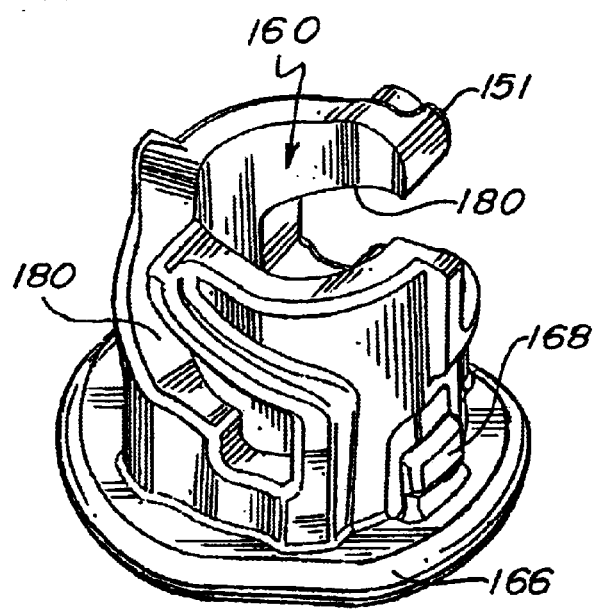
FIG. 10 is a detailed perspective view of a helical cam guide suitable for use with cassettes according to the invention.
Figure 11:
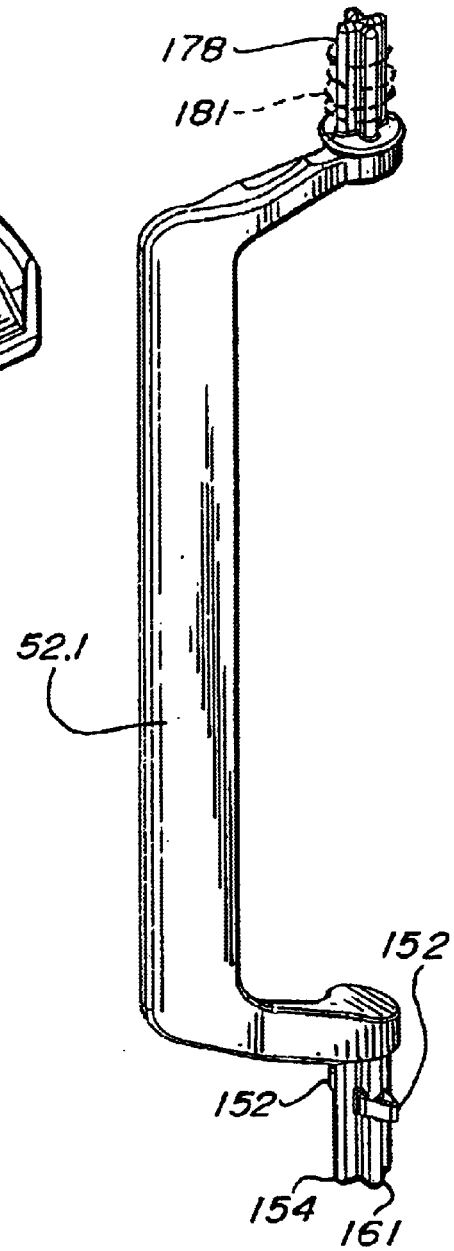
FIG. 11 is a retention member suitable for use as a film frame retainer or a wafer retainer in accordance with the invention.
Figure 12:
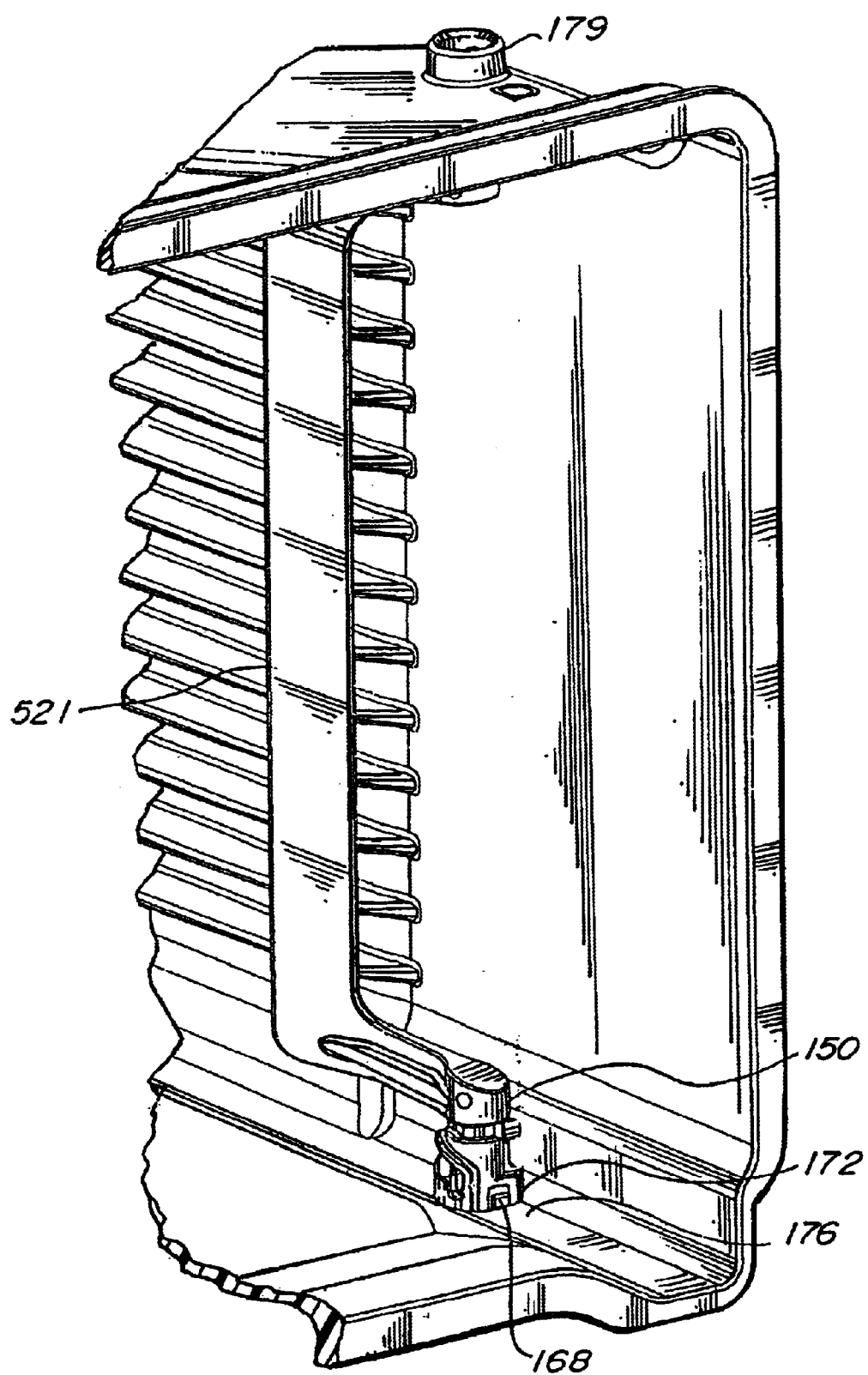
FIG. 12 is a detail perspective view of a portion of the cassette of FIG. 3 illustrating the helical cam mechanism.

Referring to FIGS. 3 and 9, an alternate embodiment of the handled are illustrated. These handles pivot on an axis substantially parallel to the top of the cassette enclosure portion. A pair of split prongs 192 lock the handle into position in apertures 194 at the top of the cassette. The handles pivotally fold down when not in use.

Referring to FIG. 1, the first cassette embodiment utilizes a door that slides vertically on and off the enclosure portion by engaging over the door flange 202 of the enclosure portion. The door 26 is preferably vacuum formed and is manually applied and removed and utilizes j-shaped guide portions 203 to secure the door to the enclosure portion door flange.

Referring to FIGS. 2, 3, 7, and 8, the second embodiment of the cassette utilizes a door that is inserted within the open front of the enclosure portion. The door is a single generally rigid integral component having a plurality of inwardly extending structural recesses 210, may provide additional retention of the film frames w as well as providing structural rigidity and further horizontal surfaces 214 and vertical surfaces 216 to friction fit with interior surfaces 220 of the enclosure portion beyond the door flange or periphery of the open front. Generally, the inwardly extending structural recesses will preferably extend at least 1 and ½ inches beyond the forward edge 224 of the door opening. This door configuration also can be vacuum-formed.

Generally all of the components contained herein may be injection molded and the entire assembly may be assembled without utilization of metal fasteners. Generally plastic materials such as carbon fiber filled polycarbonate or PEEK or other plastics traditionally used in the wafer container industry are suitable.

As illustrated herein the configuration of the cassette is being utilized for a film frame container. However, such features such as the slideably handle and side mounted retention members are also contemplated for use within wafer carriers/cassettes and this is specifically included as part of the invention herein.

We claim:

1. A cassette for holding a plurality of film frames or wafers, the cassette comprising an enclosure portion having a closed top, a closed bottom, opposing closed sidewalls, a closed backside, and an open front, the enclosure portion further comprising: zone of insertion and removal of film frames or wafers, a plurality of horizontal shelves for holding the plurality of film frames or wafers horizontally and in a spaced and vertically stacked arrangement, and a pair of rotatable C-shaped retention members comprising a shaft portion and a retention portion, the retention members having a vertical axis of rotation passing through the zone of insertion and removal and pivotally positioned adjacent the sidewalls of the enclosure portion and pivotal between a retention position to retain the film frames or wafers on the shelves and a retracted position to allow the film frames or wafers to be inserted and removed from the enclosure portion.

2. The cassette of claim 1 wherein the wafers to be held are adhered to the film frames, and wherein the cassette further comprises a door slidably engageable with the enclosure portion to cover the open front.

3. The cassette of claim 2 wherein the door slidably engages vertically with the enclosure portion from above the enclosure portion.

4. The cassette of claim 2 wherein the enclosure portion has an interior surface adjacent the open front, and wherein the door comprises structure extending inwardly toward the interior of the enclosure portion when the door is in place in the enclosure portion, and wherein the door is retained in the open front by frictional engagement with the interior surface of the enclosure portion.

5. The cassette of claim 1 wherein the retention members each have a handle connected thereto whereby the retention members can be manually moved from the retention position to the retracted position.

6. The cassette of claim 1 further comprising a pair of helical cam mechanisms connected to the retention members, and wherein each of the helical cam mechanisms have an engagement portion extending below the closed bottom of the enclosure portion whereby when the cassette is placed on a surface the engagement portion actuates the retention members moving said members from the retracted position to the retention position.

7. The cassette of claim 1 further comprising a pair of handles retractable from an extended use position to a retracted position.

8. The cassette of claim 7 wherein each handle comprises at least two resiliently flexible prongs defining at least two detents and wherein the enclosure portion has at least two apertures for receiving the resiliently flexible prongs and locking each handle in a pivotal connection to the enclosure portion.

9. The cassette of claim 1, wherein the closed top, the closed bottom, the opposing closed sidewalls, the closed backside, and the plurality of horizontal shelves are all integral and comprising plastic.

10. A cassette for holding wafers or film flumes, the cassette comprising an enclosure portion having a closed top, a closed bottom, opposing closed sidewalls, a closed backside, and an open front, the cassette having a plurality of horizontal shelves for holding the wafers or film frames horizontally in a spaced and vertically stacked arrangement; a pair of rotatable retention members having a vertical axis of rotation and pivotally positioned adjacent the sidewalls of the enclosure portion and pivotal inwardly to retain the wafers or film frames on the shelves; and a pair of handles on the enclosure portion extendible between a use position and a retracted position.

11. The cassette of claim 10 wherein each retention member is C-shaped.

12. The cassette of claim 10 wherein the enclosure portion has a zone of insertion and removal of the wafers film frames and the axis of rotation of the retention members passes through said zone of insertion and removal.

13. The cassette of claim 10 wherein the cassette further comprises a door slidably engageable with the enclosure portion to cover the open front.

14. The cassette of claim 10 wherein the enclosure portion having a door, an open interior and an interior surface adjacent the open front, the door having structure extending inwardly into the open interior and positioned to have a friction fit with the interior surface adjacent the open front to secure the door into the enclosure portion.

15. The cassette of claim 14 wherein the door has a single nominal wall.

16. The cassette of claim 10 wherein each handle comprises at least two resiliently flexible prongs defining at least two detents and wherein the enclosure portion has at least two apertures for receiving the resiliently flexible prongs and locking each handle in a pivotal connection to the enclosure portion.

17. The cassette of claim 10 wherein the closed top, the closed bottom, the opposing closed sidewalls, the closed backside, and the plurality of horizontal shelves are all integral and comprising plastic.

18. The cassette of claim 10 further comprising a pair of helical cam mechanisms connected to the retention members, and wherein each of the helical cam mechanisms have an engagement portion extending below the closed bottom of the enclosure portion whereby when the cassette is placed on a surface, the engagement portion actuates the retention members and moves the retention members from the retracted position to the retention position.

19. A cassette for holding a plurality of film frames or wafers, the cassette comprising a housing having a plurality of horizontal shelves for holding the plurality of film frames or wafers horizontally and in a spaced and vertically stacked an arrangement; a zone of insertion and removal of flint frames or wafers; and a pair of rotatable C-shaped retention members pivotal between a retention position to retain the film frames or wafers on the shelves and a retracted position to allow the film frames or wafers to be inserted and removed from the housing, the C-shaped retention members having a vertical axis rotation passing through the zone of insertion and removal.

20. The cassette of claim 19 wherein the housing further comprises a pair of handles extendible between a use position and a retracted position.

21. The cassette of claim 20 wherein each handle comprises at least two resiliently flexible prongs defining at least two detents and wherein the enclosure portion has at least two apertures for receiving the resiliently flexible prongs and locking each handle in a pivotal connection to the enclosure portion.

22. The cassette of claim 19 wherein the retention members each have a handle connected thereto whereby the retention members can be manually moved from the retention position to the retracted position.

23. The cassette of claim 19 further comprising a pair of helical cam mechanisms connected to the retention members, and wherein each of the helical cam mechanisms have an engagement portion extending below the closed bottom of the enclosure portion whereby when the cassette is placed on a surface, the engagement portion actuates the retention members and moves the retention members from the retracted position to the retention position.

24. A cassette for holding a plurality of film frames of wafers, the cassette comprising an enclosure portion having a closed top, a closed bottom, opposing closed sidewalls, a closed backside, and an open front, the enclosure portion further comprising a plurality of horizontal shelves for holding the plurality of film frames or wafers horizontally and in a spaced and vertically stacked arrangement, and a pair of rotatable C-shaped retention members pivotal between a retention position to retain the film frames or wafers on the shelves and a retracted position, the C-shaped retention members each comprising a shaft portion, a retention portion, and a vertical axis of rotation and a handle connected thereto whereby the C-shaped retention members can be manually moved from the retention position to the retracted position.

25. A cassette for holding a plurality of film frames or wafers, the cassette comprising a pair of handles retractable from an extended use position to a retracted position and an enclosure portion having a closed top, a closed bottom, opposing closed sidewalls, a closed backside, and an open front, the enclosure portion further comprising a plurality of horizontal shelves for holding the plurality of film frames or wafers horizontally and in a spaced and vertically stacked arrangement, and a pair of rotatable C-shaped retention members comprising a shaft portion and a retention portion, the C-shaped retention members having a vertical axis of rotation and pivotally positioned adjacent the side walls of the enclosure portion and pivotal between a retention position to retain the film frames or wafers on the shelves and a retracted position.

26. The cassette of claim 25 wherein each handle comprises at least two resiliently flexible prongs defining at least two detents and wherein the enclosure portion has at least two apertures for receiving the resiliently flexible prongs and locking each handle in a pivotal connection to the enclosure portion.

* * * * *